(12) United States Patent
Cleaver

(10) Patent No.: US 6,462,326 B1
(45) Date of Patent: Oct. 8, 2002

(54) CIRCUIT FOR DERIVING THE POSITION OF A FAST PULSING LASER ON A SILICON POSITION SENSING DETECTOR

(75) Inventor: Aaron K. Cleaver, Albuquerque, NM (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 09/566,674

(22) Filed: May 8, 2000

(51) Int. Cl.[7] ............................................. H01L 31/115
(52) U.S. Cl. ................................. 250/214 R; 250/214.1
(58) Field of Search ......................... 250/214 V, 214 A, 250/206.1, 206.2, 214.1; 372/29.01, 38.1

(56) References Cited

U.S. PATENT DOCUMENTS 5,347,120 A * 9/1994 Decker et al. .......... 250/214 B
6,266,142 B1 * 7/2001 Junkins et al. ............... 356/375

OTHER PUBLICATIONS

On–Trak Photonics, Inc., www.on–trak.com.theory.html.

* cited by examiner

Primary Examiner—Robert H. Kim
Assistant Examiner—Hoon K. Song
(74) Attorney, Agent, or Firm—James M. Skorich; Kenneth E. Callahan

(57) ABSTRACT

An electronic circuit is described that adapts the output of a position-sensing detector, designed to determine the position of an incident CW laser beam, to determine the position of a fast pulsing laser incident on the detector's surface.

9 Claims, 3 Drawing Sheets $$X = \frac{(X1 - X2)}{(X1 + X2)} \times \frac{L}{2} \qquad Y = \frac{(Y1 - Y2)}{(Y1 + Y2)} \times \frac{L}{2}$$

CIRCUIT FOR DERIVING THE POSITION OF A FAST PULSING LASER ON A SILICON POSITION SENSING DETECTOR

STATEMENT OF GOVERNMENT INTEREST

The invention described herein may be manufactured and used by or for the Government for governmental purposes without the payment of any royalty hereon.

BACKGROUND OF THE INVENTION

1. Field of the Invention

The present invention relates to a position-sensing detector and in particular to a method of determining the position of a fast pulsing laser incident on the detector's surface for the purpose of auto-aligning the laser.

2. Description of the Prior Art

Many laser applications involve precise alignment of the laser beam. Auto-alignment techniques all depend on accurately determining the laser beam's position in two dimensions (2D). One detector used for continuous wave (CW) lasers is a silicon photodiode called a position-sensing detector (PSD). It provides an analog output directly proportional to the position of a laser beam on the detector's active area independent of intensity fluctuations.

A one dimensional (1D) position sensing detector, shown in FIG. 1, consists of an n-type silicon substrate with two resistive layers separated by a p-n junction. The front side has an ion implanted p-type resistive layer with two contacts at opposite ends. The backside has an ion implanted n-type resistive layer with two contacts at opposite ends placed orthogonal to the contacts on the front side. The electrodes are placed at opposite ends of the p-type resistive layer. A laser beam within the spectral range of silicon will generate a photocurrent that flows from the incident point through the resistive layers to the electrodes. Since the resistivity of the ion implanted layer is extremely uniform, the photogenerated current at each electrode is inversely proportional to the distance between the incident spot of light and the electrodes. The centroid of power density of the spot is thereby tracked by the PSD (FIG. 2). See On-Trak Photonics, Inc. at www.on-trak.com/theory.html.

A two-dimensional PSD has four terminals and can output the X, Y coordinates of a laser spot on its detector surface (See FIG. 3). The photoelectric current generated by the incident laser beam flows through the device and can be seen as two input currents (X1 and X2) and two output currents (Y1 and Y2). The distribution of the output currents show the beam position of one dimension (Y) and the distribution of the input currents show the beam position of the second dimension (X) according to the equations given in FIG. 3.

PSDs and their accompanying electronics have the capability to run at less than 16 kHz. This means that commercially available systems are for use with basically CW lasers. These PSDs have sufficient response times to detect fast pulsing lasers. However, the electronics for determining the beam position for fast pulsing lasers (in the range of 100 nanosecond wide pulses and 10 kHz repetition rates) are not currently available. The present invention fulfills this need.

SUMMARY OF THE INVENTION

The present invention is an electronic circuit that interfaces with a silicon position-sensing detector to determine the position of a fast pulsing laser on the order of 100 ns wide pulses and repetition rates of 10 kHz. The PSD, designed as a continuous analog position sensor for CW lasers, is thereby converted to a position sensor for fast pulsed lasers.

BRIEF DESCRIPTION OF THE DRAWINGS

The various features of novelty that characterize the invention are pointed out with particularity in the claims annexed to and forming a part of this disclosure. For a better understanding of the invention, its operating advantages, and specific objects attained by its uses, reference is made to the accompanying drawings and descriptive matter in which a preferred embodiment of the invention is illustrated.

DESCRIPTION OF THE PREFERRED EMBODIMENT

Figure 4:
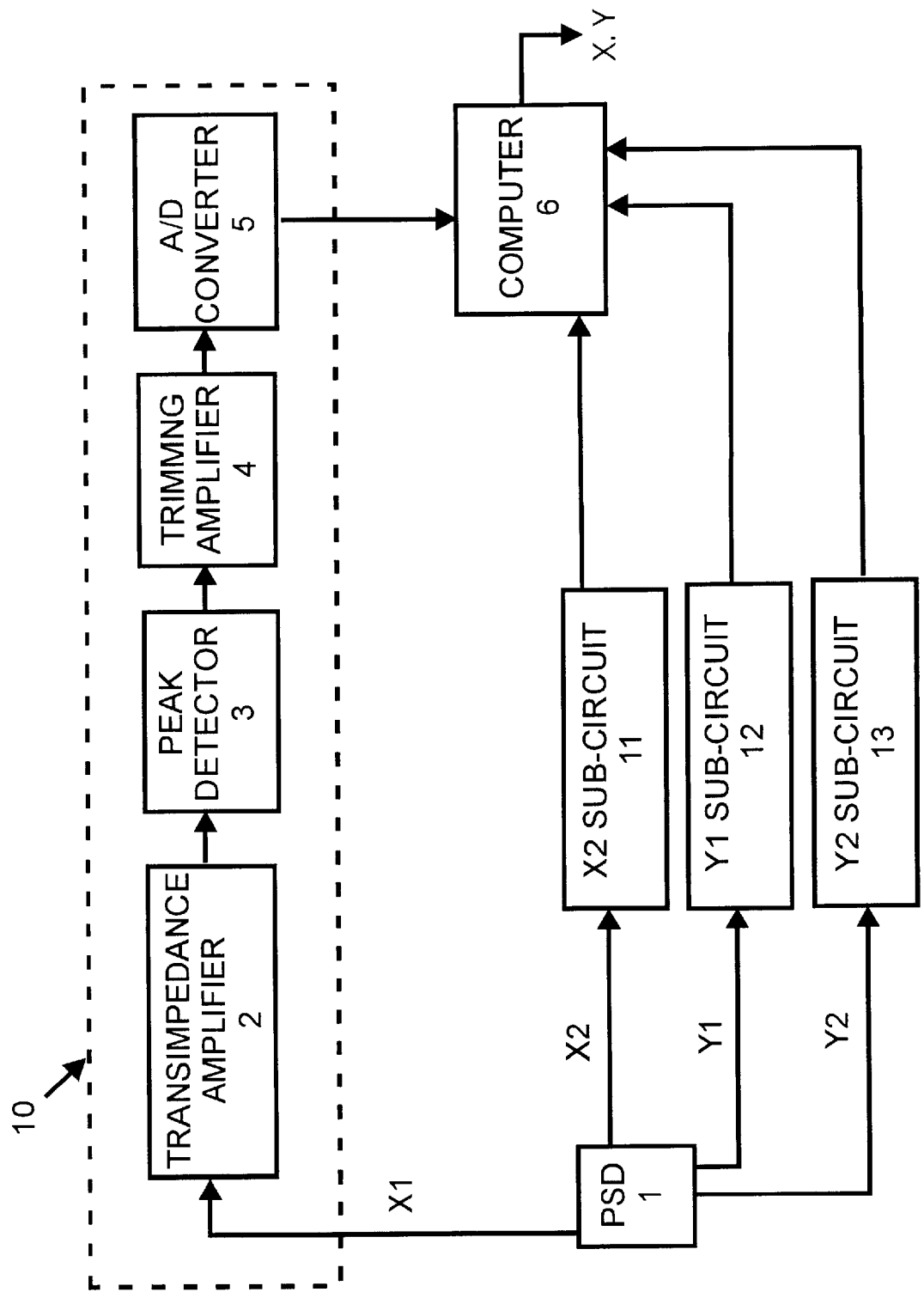
FIG. 4 is a block diagram of the position-determination circuitry.

A 2-D position-sensing detector (PSD), such as those available from On-Track Photonics, Inc., is used to determine the position of an incident pulsed laser beam. These detectors are available with a spectral range of 200 to 1100 nm and a typical rise time of approximately 100 ns. A block diagram of the circuitry for converting the PSD 1 output to pulsed laser beam position on the detector is shown in FIG. 4. The four outputs (X1, X2, Y1 and Y2) of the 2-D PSD are fed to their respective sub-circuits 10, 11, 12, and 13. The X1 sub-circuit 10 is expanded to show the individual components; the other sub-circuits are identical. The laser pulses of particular interest are in the range of 100 ns pulse width with pulse repetition frequencies (PRFs) on the order of 10 kHz. The circuitry, however, can be tailored to a wide range of pulse widths and PRFs, limited only by the rise time response of the PSDs.

A laser pulse incident upon the sensitive surface of the PSD generates a pulse of photoelectric current. This current pulse flows through the device and can be viewed as an input bias current pulse divided into two output current pulses. These current pulses are detected by the two terminals located at the extremes of the sensitive surface in the dimension being measured, e.g., Y1 and Y2. The measured position in this dimension is then given by the equation, $$Y = \frac{Y1 - Y2}{Y1 + Y2} + \frac{L}{2} \qquad (1)$$

where L is the distance between the two terminals in the Y dimension. The pulse position in a second dimension (X) is determined in the identical manner using a 2-D PSD. A separate sub-circuit, described below, manipulates the current pulse output from each terminal, transforming it into a digital number proportional to the peak of the current pulse registered at that terminal. These digital numbers are input to a computer where equation (1) is calculated to find the laser beam position in each dimension.

Figure 1:
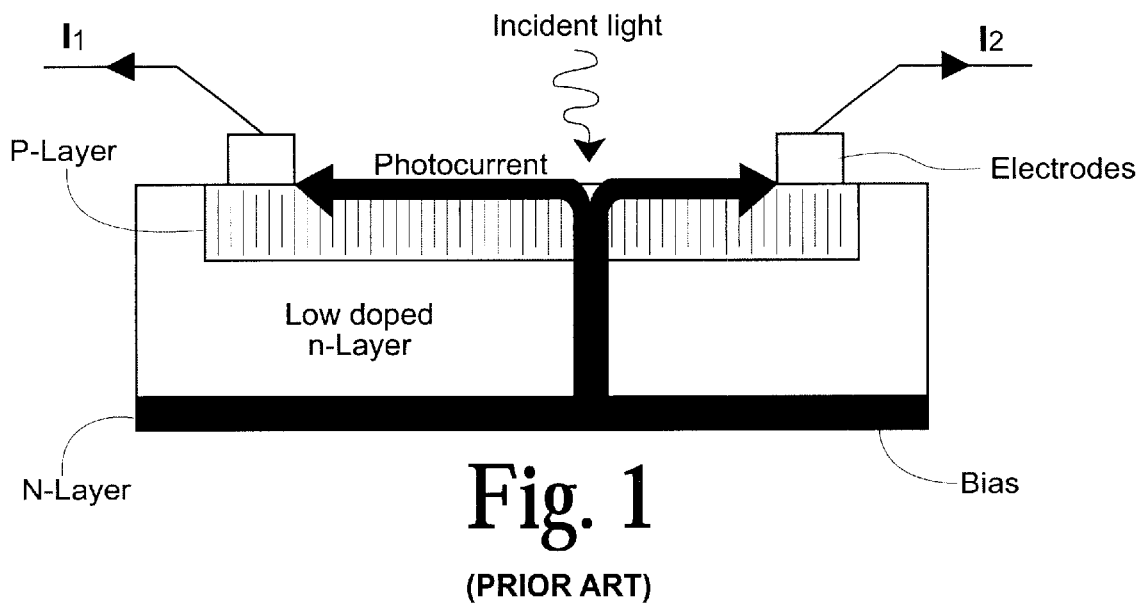
FIG. 1 is a side view of a one-dimensional PSD.
Figure 2:
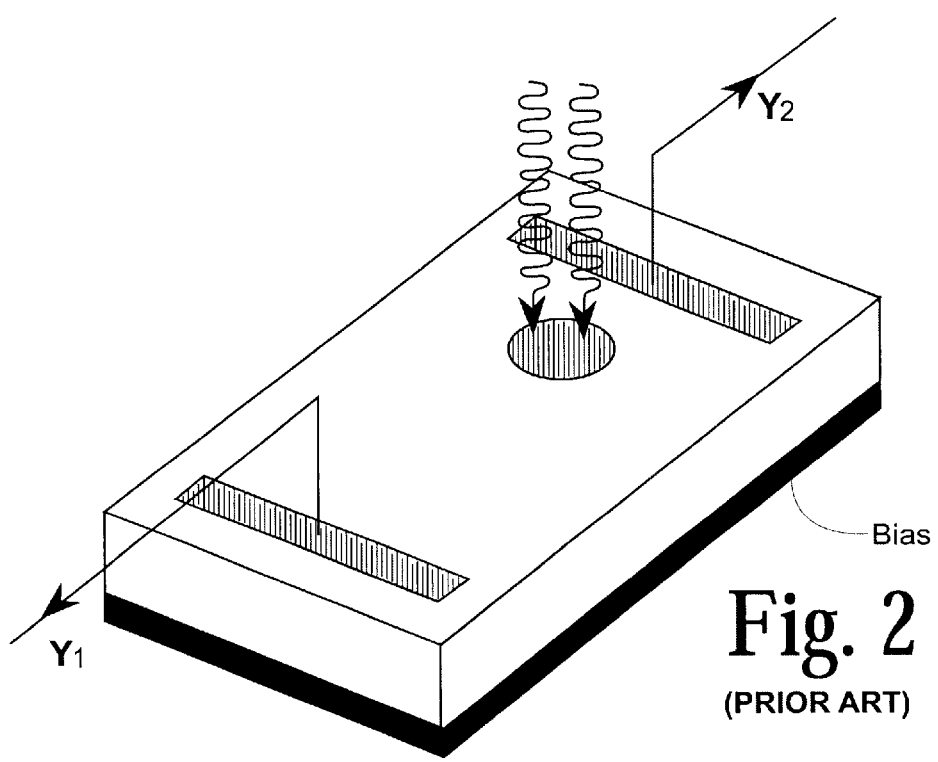
FIG. 2 is an oblique view of a one-dimensional PSD.
Figure 3:
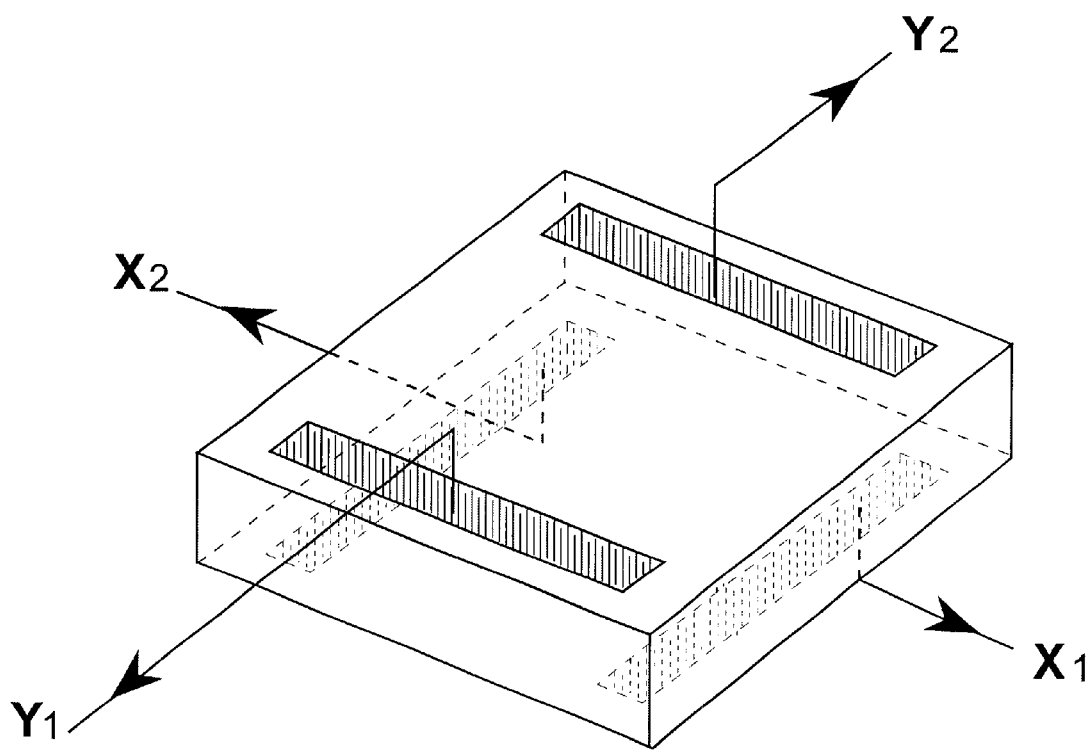
FIG. 3 is an oblique view of a two-dimensional PSD.

The electronic circuit constituting the present invention consists of two identical sub-circuits for each dimension to be measured plus a computer to calculate the laser position from the sub-circuit outputs. For a 2-D PSD 1, as shown in FIG. 3 and FIG. 4, four sub-circuits are required. Each sub-circuit is comprised of a transimpedance amplifier 2, a peak detector 3, a trimming amplifier 4, and an A/D converter 5.

The transimpedance amplifier 2 converts the current pulse output of the PSD into a voltage and amplifies the pulse to a detectable value. The output is a stretched version of the laser pulse. A peak detector 3 follows the output of the transimpedance amplifier. It determines and holds the peak value of the pulse. The peak detector should have a slew rate at least as fast as that of the pulse output from the transimpedance amplifier. It must also have the ability to reset so it can acquire the next pulse and a settling time that is faster than the time between pulses. The reset pulse is how the circuit is synced to the laser.

The trimming amplifier 4 has a three-fold purpose. First, it is a second gain stage so that the transimpedance amplifier and peak detector do not have to work as hard. Secondly, it sets the range of the position signals and can be used to zero out the detector. For example, one could move the laser beam to an extreme of the detector causing the maximum current to flow in the channel you are testing. This value is used to set the maximum voltage level. Lastly, the final amplifier stage provides a buffering effect for driving an A/D converter or other circuitry.

For a digital output, an A/D converter 5 is used to provide a convenient input to the computer 6. The computer calculates the laser beam position (X, Y) from the digitized values of X1, X2, Y1 and Y2 for each laser pulse according to the equations shown in FIG. 3. The system is readily adaptable for determining laser beam positions in one-, two-, or three-dimension PSDs.

There are a number of applications for the present invention related to maintaining the laser beam on a desired target by using the PSD output to generate error signals. For example, a beam splitter could deflect a small portion of the laser beam to the PSD, the output of which would be used to maintain the laser's alignment.

What is claimed is:

1. An electronic circuit for determining the position of a fast pulsing laser beam using a position-sensing detector that outputs two current pulse values for each position dimension that are proportional to the laser beam's position in that dimension, the electronic circuit is comprised of two identical sub-circuits per dimension plus computer means for calculating the laser beam's position based on the sub-circuit inputs, each sub-circuit comprised of:

a. a transimpedance amplifier to receive a current pulse value from the position-sensing detector, outputting an amplified voltage pulse;

b. a peak detector to receive the transimpedance amplifier output, outputting an extended voltage pulse at the peak voltage level;

c. a trimming amplifier to receive the peak detector output and outputting a signal that further amplifies, adjusts the maximum and minimum voltage range, and buffers the peak detector output; and d. an A/D converter to digitize the trimming amplifier output, thereby providing an appropriate input to said computer means.

2. An electronic circuit as defined in claim 1, wherein the peak detector is capable of acquiring laser pulse widths of less than approximately 100 nanoseconds.

3. An electronic circuit as defined in claim 2, wherein the peak detector is capable of acquiring laser pulses having a frequency of at least approximately 10 kHz.

4. An electronic circuit as defined in claim 1, wherein the peak detector is capable of acquiring laser pulses having a frequency of at least approximately 10 kHz.

5. A method for determining a position of a fast pulsing laser beam comprising the steps of:

generating two current pulse values from a position-sensing detector for each dimension of the position, with each of the current pulse values being proportional to the position in the dimension;

amplifying each of the current pulse values to produce, respectively, an amplified voltage pulse having a peak voltage level;

generating a signal by extending the amplified voltage pulse at the peak voltage level to produce an extended voltage pulse; and digitizing the signal to provide an appropriate input to a computer means for calculating the position of the fast pulsing laser beam.

6. A method as defined in claim 5 wherein consecutive current pulse values are separated by an interval of $10^{-4}$ seconds, and further comprising resetting the extended voltage pulse to zero during the interval.

7. A method as defined in claim 6, wherein generating the signal includes amplifying the extended voltage pulse.

8. A method as defined in claim 7, wherein the extended voltage pulse has a voltage range and generating the signal includes adjusting the voltage range.

9. A method as defined in claim 8, wherein generating the signal includes buffering the extended voltage pulse.

* * * * *